(12) United States Patent
Wada et al.

(10) Patent No.: US 11,158,751 B2
(45) Date of Patent: Oct. 26, 2021

(54) PHOTOELECTRIC CONVERSION ELEMENT AND PHOTODETECTOR

(71) Applicant: Kabushiki Kaisha Toshiba, Minato-ku (JP)

(72) Inventors: Atsushi Wada, Kawasaki (JP); Rei Hasegawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 173 days.

(21) Appl. No.: 15/909,707

(22) Filed: Mar. 1, 2018

(65) Prior Publication Data

US 2019/0035956 A1 Jan. 31, 2019

(30) Foreign Application Priority Data

Jul. 28, 2017 (JP) .............................. JP2017-146067

(51) Int. Cl.

| | | |
|---|---|---|
| *H01L 31/04* | (2014.01) | |
| *H01L 31/0224* | (2006.01) | |
| *H01L 21/02* | (2006.01) | |
| *H01L 51/00* | (2006.01) | |
| *G01T 1/20* | (2006.01) | |
| *H01L 31/02* | (2006.01) | |
| *H01L 51/42* | (2006.01) | |

(52) U.S. Cl.
CPC ............ *H01L 31/04* (2013.01); *G01T 1/2006* (2013.01); *H01L 21/0226* (2013.01); *H01L 31/0224* (2013.01); *H01L 51/0036* (2013.01); *H01L 51/0046* (2013.01); *H01L 31/02024* (2013.01); *H01L 51/424* (2013.01)

(58) Field of Classification Search
None
See application file for complete search history.

(56) References Cited

U.S. PATENT DOCUMENTS

| | | | | |
|---|---|---|---|---|
| 6,864,111 | B2 * | 3/2005 | Yu .......................... | B82Y 10/00 257/E27.129 |
| 2005/0224905 | A1 * | 10/2005 | Forrest ................... | B82Y 10/00 257/461 |
| 2007/0235727 | A1 * | 10/2007 | Setayesh ............. | H01L 51/0026 257/40 |

(Continued)

FOREIGN PATENT DOCUMENTS

| | | |
|---|---|---|
| JP | 2012-190954 | 10/2012 |
| JP | 5040057 | 10/2012 |
| KR | 10-2012-0091700 A | 8/2012 |

OTHER PUBLICATIONS

Sakai, "Annealing effect in the sexithiophene:C70 small molecule bulk heterojunction organic photovoltaic cells", Solar Energy Materials & Solar Cells 93 (2009) 1149-1153 (Year: 2009).*

(Continued)

*Primary Examiner* — Devina Pillay
(74) *Attorney, Agent, or Firm* — Oblon, McClelland, Maier & Neustadt, L.L.P.

(57) ABSTRACT

According to an embodiment, a photoelectric conversion element includes a photoelectric conversion layer that converts light to charges. The photoelectric conversion layer contains oligothiophene and fullerene selected from a group including a fullerene and derivatives thereof. A content ratio of the oligothiophene and the fullerene is 500:1 to 5:1 by weight.

12 Claims, 4 Drawing Sheets

(56) References Cited

U.S. PATENT DOCUMENTS

2011/0203649 A1* 8/2011 Konemann .......... C07D 241/38
136/255
2016/0329498 A1* 11/2016 Bae ..................... C07C 43/168

OTHER PUBLICATIONS

Li, Achieving EQE of 16,700% in P3HT5PC71BM based photodetectors by trap-assisted photomultiplication, Scientific , Reports, 5 : 9181, pp. 1-7, 2015 (Year: 2015).*

Lingliang Li, et al. "Achieving EQE of 16,700% in P3HT:PC$_{71}$BM based photodetectors by trap-assisted photomultiplication", Scientific Reports 5:9181, 2015, 7 pages.

* cited by examiner

[IN DARKNESS]

[DURING LIGHT IRRADIATION]

HOLE INJECTION

PHOTOELECTRIC CONVERSION ELEMENT AND PHOTODETECTOR

CROSS-REFERENCE TO RELATED APPLICATIONS

This application is based upon and claims the benefit of priority from Japanese Patent Application No. 2017-146067, filed on Jul. 28, 2017; the entire contents of which are incorporated herein by reference.

FIELD

Embodiments described herein relate generally to a photoelectric conversion element and a photodetector.

BACKGROUND

There is known a photoelectric conversion element including a photoelectric conversion layer that converts light to charges. There is also known a photoelectric conversion element that includes a photoelectric conversion layer in which polythiophene and a fullerene-based material are mixed at a ratio from 100:1 to 100:15.

However, the conventional photoelectric conversion layer cannot achieve significant improvements on the photoelectric conversion efficiency, and it is therefore difficult to achieve significant improvements on the sensitivity.

DETAILED DESCRIPTION

According to an embodiment, a photoelectric conversion element includes a photoelectric conversion layer that converts light to charges. The photoelectric conversion layer contains oligothiophene and fullerene selected from a group including a fullerene and derivatives thereof. A content ratio of the oligothiophene and the fullerene is 500:1 to 5:1 by weight.

Embodiments are described below in detail with reference to the accompanying drawings.

First Embodiment

Figure 1:
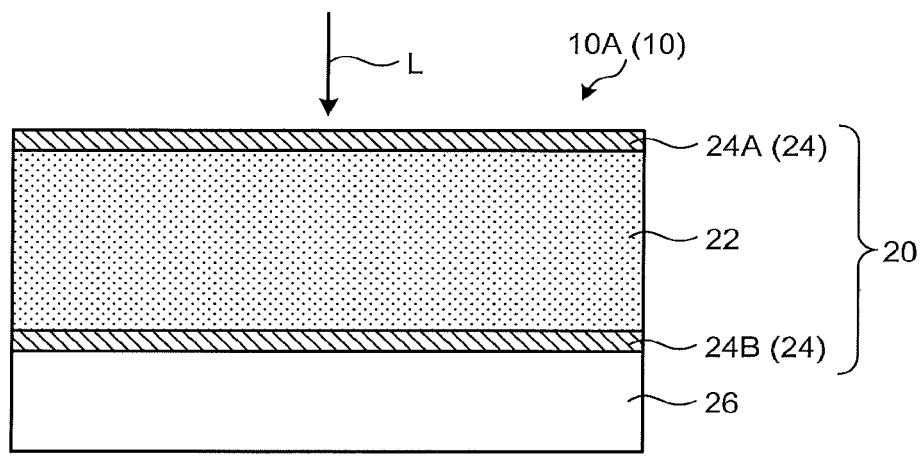
FIG. 1 is a schematic diagram of a photodetector.

FIG. 1 is a schematic diagram illustrating an example of a photodetector 10A according to the present embodiment. The photodetector 10A is an example of a photodetector 10.

The photodetector 10A includes a photoelectric conversion element 20. In the present embodiment, the photodetector 10A is a stacked body including a substrate 26 and the photoelectric conversion element 20.

The substrate 26 supports the photoelectric conversion element 20. The substrate 26 transmits light L being incident on the photodetector 10A. The light L includes a wavelength as a target to be detected by the photoelectric conversion element 20. The light L is radiation or visible light, for example.

The substrate 26 is a transparent substrate formed of glass or synthetic resin, for example.

The photoelectric conversion element 20 is a stacked body including a photoelectric conversion layer 22 and electrode layers 24.

The photoelectric conversion layer 22 converts the light L to charges.

In the present embodiment, the photoelectric conversion layer 22 contains oligothiophene and fullerene.

The content ratio of the oligothiophene and the fullerene in the photoelectric conversion layer 22 is 500:1 to 5:1 by the weight. The content ratio of the oligothiophene and the fullerene is preferably in a range from 500:1 to 10:1 by the weight, and is particularly preferably in a range from 100:1 to 10:1.

Fullerene is a material selected from a group including a fullerene and derivatives thereof. Fullerene is an organic n-type compound (n-type organic semiconductor) and is an electron-accepting compound. In other words, fullerene is compound that accepts electrons from an electron-donating compound, when absorbing the light L. In the present embodiment, the fullerene in the photoelectric conversion layer 22 accepts electrons from the oligothiophene in that photoelectric conversion layer 22, when absorbing the light L.

A fullerene is a lower fullerene constituted by 20 or more and 59 or less carbon atoms or a higher fullerene constituted by 60 or more carbon atoms. Fullerene does not include carbon nanotubes.

It is preferable that a fullerene is a higher fullerene. Examples of the higher fullerene are a fullerene $C_{60}$, a fullerene $C_{70}$, a fullerene $C_{-76}$, a fullerene $C_{78}$, a fullerene $C_{80}$, a fullerene $C_{82}$, a fullerene $C_{84}$, a fullerene $C_{90}$, a fullerene $C_{96}$, a fullerene $C_{240}$, a fullerene $C_{540}$, and a mixture consisting of any combination of the fullerences. The number as the subscript of C represents the number of carbon atoms.

A fullerene derivative represents a compound in which a substituent is added to this fullerene. An alkyl group, an aryl group, or a heterocyclic group is preferable as the substituent. As the fullerene derivative, compounds described in Japanese Patent Application Laid-open No. 2007-123707 are preferable, for example.

The number of carbons in the substituent added to the fullerene is preferably 1 or more and 30 or less, and is more preferably 1 or more and 10 or less. In a case where a fullerene has substituents, the number of the substituents is not limited. For example, the number of the substituents of the fullerene is preferably 1 or more and 60 or less, and is more preferably 1 or more and 10 or less.

As the fullerene contained in the photoelectric conversion layer 22, the fullerenes $C_{60}$, $C_{70}$, $C_{84}$, and $C_{90}$, for example, are preferable from the reason of purity of the material. Among these fullerenes, a fullerene $C_{60}$ represented by Formula (1) described below is particularly preferable.

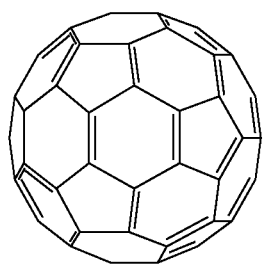

(1)

Meanwhile, the oligothiophene is an organic p-type compound (p-type organic semiconductor) and is an electron-donating compound. In other words, the oligothiophene is a compound that donates electrons to the fullerene that is electron-accepting compound, when absorbing the light L.

The oligothiophene is an oligomer of thiophene. The oligothiophene can be unsubstituted oligothiophene or oligothiophene with substituents.

As unsubstituted oligothiophene, unsubstituted α-oligothiophene is preferable in which thiophenes are bonded to each other at α positions. The repeating number of thiophene units in unsubstituted α-oligothiophene is not limited. For example, unsubstituted α-oligothiophene is preferably a dimer or more, more preferably a hexamer or more, and is particularly preferably a hexamer (see a hexamer of unsubstituted α-oligothiophene represented by Formula (2) described below).

(2)

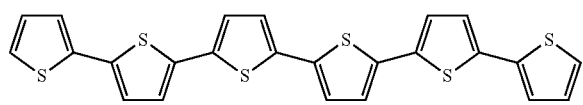

In a case where the oligothiophene has substituents, the substituents are not limited. For example, an alkyl group, an aryl group, or a heterocyclic group is preferable as the substituents of the oligothiophene. The number of carbons in the substituents added to the oligothiophene is preferably 1 or more and 30 or less, and is more preferably 1 or more and 10 or less.

In a case where the oligothiophene has substituents, the number of the substituents is not limited. For example, the number of the substituents of the oligothiophene is preferably 1 or more and 30 or less, and is more preferably 1 or more and 12 or less.

The number of kinds of the oligothiophene and the number of kinds of the fullerene in the photoelectric conversion element 20 are not limited. That is, the photoelectric conversion element 20 can contain one kind or a plurality of kinds of oligothiophene and one kind or a plurality of kinds of fullerene.

In a case where the photoelectric conversion element 20 contains plural kinds of oligothiophene and plural kinds of fullerene, it suffices, with regard to the content ratio, that a ratio between the total weight of the plural kinds of oligothiophene and the total weight of the plural kinds of fullerene in the photoelectric conversion element 20 satisfies the weight ratio described above.

A combination of the oligothiophene and the fullerene in the photoelectric conversion layer 22 is not limited. For example, a combination of unsubstituted α-oligothiophene and the fullerene $C_{60}$ is preferable as the combination of the oligothiophene and the fullerene in the photoelectric conversion element 20. Other combinations include a combination of α-oligothiophene and the fullerene $C_{70}$, a combination of α-oligothiophene and the fullerene $C_{84}$, and a combination of β-oligothiophene and the fullerene $C_{70}$.

The photoelectric conversion layer 22 is preferably formed of the oligothiophene and the fullerene. That is, it is preferable that no contaminant is contained in the photoelectric conversion layer 22. In the present embodiment, contaminant means a constituent other than the oligothiophene and the fullerene contained in the photoelectric conversion layer 22. The contaminant is a solvent used for creating the photoelectric conversion layer 22, for example, but is not limited thereto.

Specifically, the amount of contaminant in the photoelectric conversion layer 22 is preferably 0.1 wt % or less with respect to the total amount of the photoelectric conversion layer 22 that is 100 wt %, more preferably 0.01 wt % or less, and particularly preferably 0.001 wt % or less.

It is preferable that the photoelectric conversion layer 22 is a layer formed by a deposition method. It is more preferable that the photoelectric conversion layer 22 is a layer formed by a vacuum deposition method. In a case of forming the photoelectric conversion layer 22 by a deposition method, it suffices to use a known condition as a forming condition.

By using the layer formed by a deposition method as the photoelectric conversion layer 22, it is possible to reduce the amount of contaminant in the photoelectric conversion layer 22, as compared with a case of forming that layer by coating.

The thickness of the photoelectric conversion layer 22 is not limited. The thickness of the photoelectric conversion layer 22 is preferably 10 nanometers or more and 100 micrometers or less, and is more preferably 50 nanometers or more and 100 micrometers or less, for example.

Next, the electrode layers 24 are described.

In the present embodiment, the electrode layers 24 include an electrode layer 24A and an electrode layer 24B. When the electrode layer 24A and the electrode layer 24B are collectively described, these layers are simply referred to as "the electrode layers 24".

The photoelectric conversion layer 22 is arranged between this pair of electrode layers 24 (electrode layers 24A and 24B). At least one of the electrode layers 24A and 24B can be arranged to be in contact with the photoelectric conversion layer 22.

The electrode layers 24 are electrically conductive and transmit light incident on the electrode layers 24. The term "transmit" means that 80% or more of incident light is transmitted. The light incident on the electrode layers 24 is radiation and scintillation light.

The electrode layers 24 are formed of an electrically conductive material. The electrode layers 24 are formed of metal oxide, metal, or alloy, for example. The metal oxide is indium oxide, zinc oxide, tin oxide, or indium tin oxide (ITO) or fluorine-doped tin oxide (FTO) which are complexes thereof, for example. The metal is aluminum, gold, or the like.

The thickness of the electrode layers 24 is not limited. The thickness of the electrode layers 24 is 35 nanometers, for example.

In the present embodiment, the electrode layer 24B is arranged between the substrate 26 and the photoelectric conversion layer 22. The electrode layer 24B receives holes as charges from the photoelectric conversion layer 22. The electrode layer 24B is formed of metal oxide, for example.

A flattening layer can be arranged between the electrode layer 24B and the photoelectric conversion layer 22. In this case, it suffices that the electrode layer 24B receives the holes from the photoelectric conversion layer 22 via the flattening layer.

The flattening layer is arranged to be in contact with at least one of the electrode layer 24B and the photoelectric conversion layer 22, for example. The flattening layer is a layer for flattening a surface of an underlying layer, thereby achieving flatness of a layer to be arranged on the flattening layer.

The flattening layer can contain a mixture (PEDOT: PSS) of poly (ethylenedioxythiophene) and poly (styrenesulfonate), for example. Further, the flattening layer can contain a polythiophene-based polymer or conductive ink, for example.

Meanwhile, the electrode layer 24A is arranged on one side of the photoelectric conversion layer 22 which is opposite to the electrode layer 24B. The electrode layer 24A receives electrons as charges from the photoelectric conversion layer 22. It suffices that the electrode layer 24A is formed of metal oxide, metal, or alloy, for example.

Next, an operation of the photoelectric conversion element 20 is described.

Figure 2A:
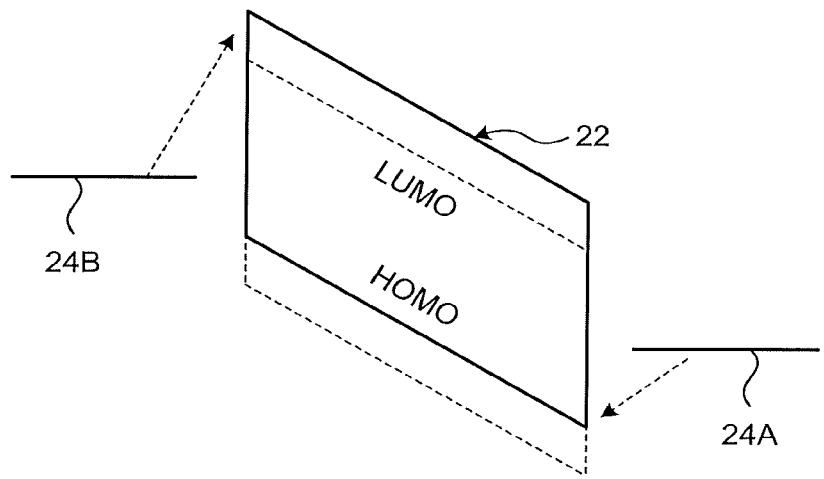
FIGS. 2A and 2B are explanatory diagrams of an operation of a photoelectric conversion element.
Figure 2B:
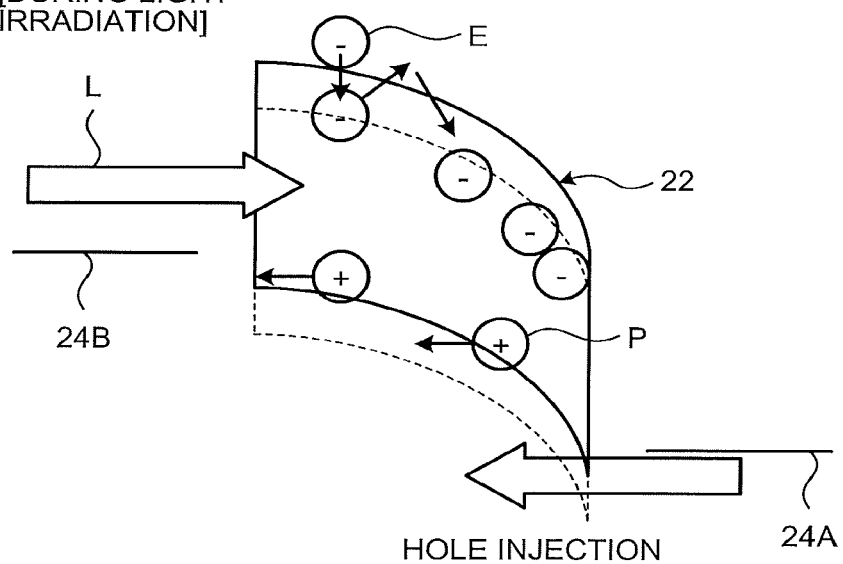

FIGS. 2A and 2B are explanatory diagrams of the operation of the photoelectric conversion element 20. As illustrated in FIG. 2A, when the light L is not radiated, that is, in darkness, no charge is generated in the photoelectric conversion layer 22. On the other hand, as illustrated in FIG. 2B, when the light L is incident on the photoelectric conversion layer 22, charges are generated in the photoelectric conversion layer 22.

The photoelectric conversion layer 22 contains excessive oligothiophene that is 5 or more and 500 or less times the fullerene at the weight ratio, as described above. In other words, a quite small quantity of fullerene, which is 1/500 or more and 1/5 or less times oligothiophene at the weight ratio, is contained in the photoelectric conversion layer 22.

In this manner, the quantity of the fullerene with respect to the oligothiophene is significantly small in the photoelectric conversion layer 22. Therefore, it is considered that electrons E generated by incidence of the light L on the photoelectric conversion layer 22 are trapped by the fullerene. The trapped electrons E reach the electrode layer 24A due to thermal excitation and are accumulated therein. It is considered that, because of injection of holes P from the electrode layer 24A, the electrons E accumulated in the electrode layer 24A are caused to flow into the electrode layer 24B at once by the oligothiophene excessively contained in the photoelectric conversion layer 22.

It is considered that oligothiophene can increase mobility of the electrons E, as compared with polythiophene. Therefore, it is considered that the electrons E accumulated in the electrode layer 24A are caused to flow into the electrode layer 24B by oligothiophene with increased mobility, as compared with a case where oligothiophene is not used.

Accordingly, it is considered that the photoelectric conversion layer 22 of the photoelectric conversion element 20 of the present embodiment can achieve a remarkable multiplication factor, and can achieve a photoelectric conversion efficiency of 1000% or higher.

The photoelectric conversion efficiency means the amount of an output signal output when the light L is radiated to the photoelectric conversion element 20. A photoelectric conversion efficiency of 100% indicates that an output signal corresponding to one charge is obtained with respect to one photon converted by the photoelectric conversion element 20. Meanwhile, a photoelectric conversion efficiency of 1000% indicates that an output signal corresponding to charges ten times larger is obtained with respect to one photon converted by the photoelectric conversion element 20.

As described above, the photoelectric conversion element 20 of the present embodiment can significantly improve the photoelectric conversion efficiency. That is, the photoelectric conversion element 20 of the present embodiment can achieve a higher photoelectric conversion efficiency with a smaller applied voltage. The photoelectric conversion element 20 also can obtain an output signal with a desired strength by photoelectric conversion with a smaller applied voltage.

Therefore, the photoelectric conversion element 20 of the present embodiment can significantly improve the sensitivity.

Further, it is preferable that the photoelectric conversion layer 22 is a layer formed by a deposition method, as described above. By forming the photoelectric conversion layer 22 by a deposition method, it is possible to reduce the amount of contaminant in the photoelectric conversion layer 22, as compared with a case of forming that layer by coating. Therefore, it is possible to further improve the photoelectric conversion efficiency of the photoelectric conversion element 20.

Second Embodiment

The configuration of the photodetector 10 is not limited to the photodetector 10A of the first embodiment (see FIG. 1). For example, the photodetector 10B may be an indirect-conversion photodetector 10 with a scintillator further stacked thereon.

Figure 3:
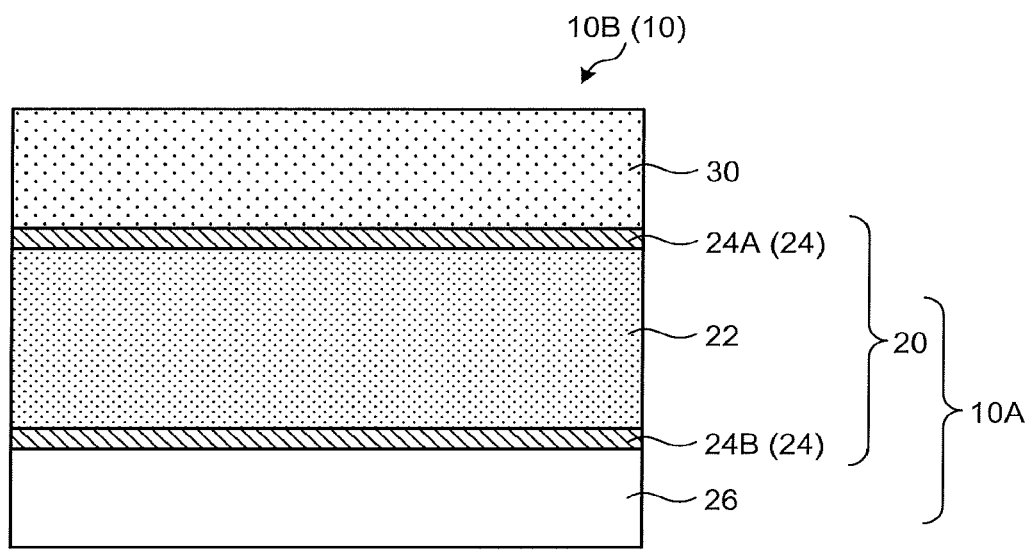
FIG. 3 is a schematic diagram of a photodetector.

FIG. 3 is a schematic diagram illustrating an example of a photodetector 10B according to the present embodiment. The photodetector 10B is an example of the photodetector 10. Functions and configurations identical to those of the above embodiment are denoted by like reference signs and redundant explanations thereof will be omitted.

The photodetector 10B is a stacked body including the photodetector 10A of the first embodiment and a scintillator 30. The configuration of the photodetector 10A is identical to that of the first embodiment.

The scintillator 30 converts light L incident thereon to scintillation light.

The scintillator 30 is formed of a scintillator material. The scintillator material emits scintillation light (fluorescence) when radiation is incident thereon. Examples of the scintillator material are $Lu_2SiO_5$: (Ce), $LaBr_3$: (Ce), YAP (yttrium aluminum pervoskite):Ce, Lu(Y)AP:Ce, NaI (sodium iodide), zinc sulfide, anthracene, stilbene, naphthalene, diphenyloxazole (PPO), plastic, GSO-gadolinium orthosilicate (Ce-doped $Gd_2SiO_5$), CsI, CsI(T1), CsI(Na), $Bi_4Ge_3O_{12}$, Ce-doped $Lu_2SiO_5$, NaI(T1), $CeF_3$, $PbWO_4$, $BaF_2$, $PbF_2$, LiI(Eu), LYSO—$Lu_{2(1-x)}Y_{2x}SiO_5$:Ce, LGSO (Lu, $Gd)_2SiO_5$, and $Al_2O_3$.

The thickness of the scintillator 30 is not limited. For example, the thickness of the scintillator 30 is 100 micrometers or more and 10 millimeters or less.

In the photoelectric conversion layer 22 in the photodetector 10B, the content ratio of the oligothiophene and the fullerene in the photoelectric conversion layer 22 is 500:1 to 5:1 by the weight, as described in the first embodiment.

Therefore, also in a case where the scintillator 30 is further included, the photodetector 10B can significantly improve the sensitivity, as in the first embodiment.

Third Embodiment

The photodetector 10 may have a configuration in which the scintillator material is distributed in the photoelectric conversion layer 22.

Figure 4:
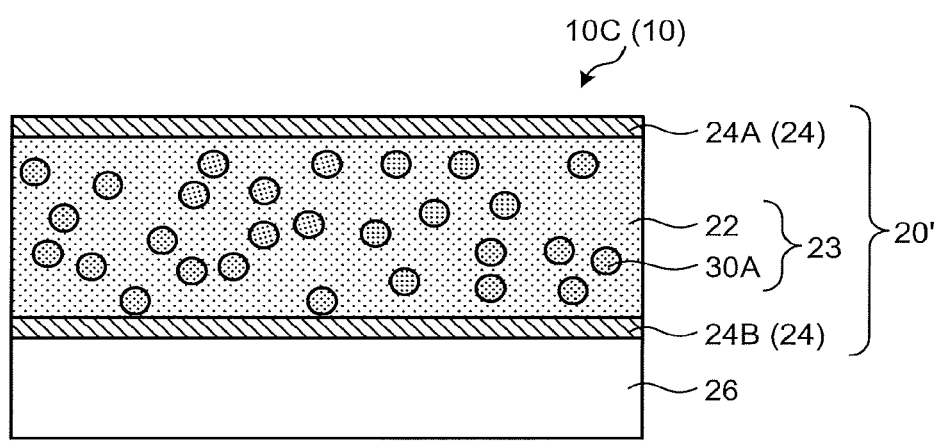
FIG. 4 is a schematic diagram of a photodetector.

FIG. 4 is a schematic diagram illustrating an example of a photodetector 10C according to the present embodiment. Functions and configurations identical to those of the above embodiments are denoted by like reference signs and redundant explanations thereof will be omitted.

The photodetector 10C is a stacked body including the substrate 26 and a photoelectric conversion element 20'. In the present embodiment, the photoelectric conversion element 20' includes a mixed layer 23. The mixed layer 23 is arranged between the electrode layer 24A and the electrode layer 24B.

The mixed layer 23 is a layer corresponding to the photoelectric conversion layer 22 with a scintillator material 30A distributed therein. It suffices that the scintillator material 30A is formed of one material or a plurality of materials selected from the group of the scintillator materials listed in the second embodiment.

In the photoelectric conversion layer 22 in the photodetector 10C, the content ratio of the oligothiophene and the fullerene in the photoelectric conversion layer 22 is 500:1 to 5:1 by the weight, as described in the first embodiment.

Therefore, also in a case where the mixed layer 23 corresponding to the photoelectric conversion layer 22 with the scintillator material 30A distributed therein is arranged between the pair of electrode layers 24 (electrode layers 24A and 24B), the photodetector 10C can significantly improve the sensitivity, as in the first embodiment.

EXAMPLES

Example 1

The photodetector 10A having the configuration illustrated in FIG. 1 was created. First, a 0.7 mm-thick glass substrate was prepared as the substrate 26. An ITO electrode having a thickness of 50 nanometers was formed on the substrate 26 by sputtering, thereby forming the electrode layer 24B. A flattening material was formed on the electrode layer 24B to have a thickness of 30 nanometers by spin coating.

Further, the photoelectric conversion layer 22 was formed on the flattening layer by a deposition method, which contained a hexamer of α-oligothiophene and a fullerene $C_{60}$ at a content ratio of 100:1 by the weight. The electrode layer 24A was then formed by forming an aluminum layer to have a thickness of 100 nanometers on the photoelectric conversion layer 22 by a deposition method. In this manner, the photodetector 10A of Example 1 was created.

Figure 5:
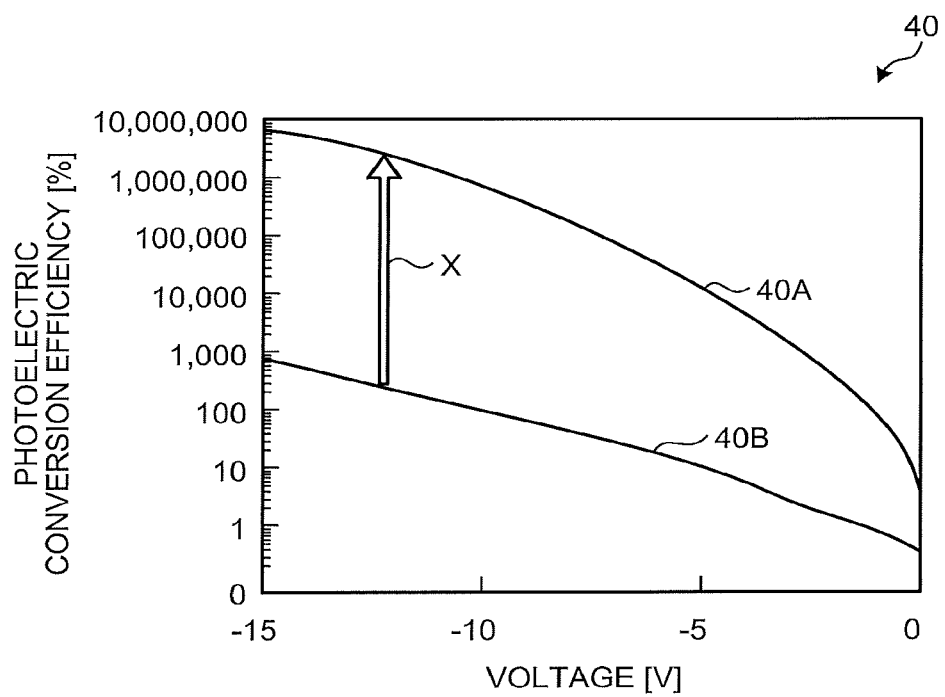
FIG. 5 is a chart illustrating a relation of a photoelectric conversion efficiency with respect to an applied voltage.

With regard to the created photodetector 10A, radiation of 450-nm light L and voltage application to the electrode layers 24A and 24B were performed, and the photoelectric conversion efficiency was measured. A measurement result was obtained as illustrated with a line 40A in FIG. 5. FIG. 5 is a line chart 40 illustrating a relation of the photoelectric conversion efficiency with respect to the voltage applied to the photoelectric conversion layer 22.

Further, with regard to the created photodetector 10A, hole mobility and electron mobility in the photoelectric conversion layer 22 were measured under a measurement condition of a field effect transistor (FET) method. As a result, the hole mobility in the photoelectric conversion layer 22 was $10^{-2}$ to $10^{-3}$ cm$^2$/Vs. The electron mobility in the photoelectric conversion layer 22 was $2.5 \times 10^{-4}$ cm$^2$/Vs.

Comparative Example 1

On the flattening layer, a comparative photoelectric conversion layer was created by coating, which contained poly(3-hexylthiophene) (P3HT) and a fullerene derivative (PC71BM) at a content ratio of 100:1 by the weight. A comparative photodetector A was created in an identical manner to Example 1, except that this comparative photoelectric conversion layer was formed by coating in place of the photoelectric conversion layer 22.

With regard to the created comparative photodetector A, radiation of 530-nm light L and voltage application to the electrode layers 24A and 24B were performed, and the photoelectric conversion efficiency was measured. A measurement result was obtained as illustrated with a line 40B in FIG. 5.

Further, with regard to the created comparative photodetector A, hole mobility and electron mobility in the comparative photoelectric conversion layer were measured by a time-of-flight measurement (TOF) method. As a result, the hole mobility in the comparative photoelectric conversion layer was $10^{-2}$ to $10^{-3}$ cm/Vs. Meanwhile, the electron mobility in the comparative photoelectric conversion layer was $1.5 \times 10^{-4}$ cm$^2$/Vs. As described above, the electron mobility in the comparative photoelectric conversion layer was smaller than the electron mobility in the photoelectric conversion layer 22 of the photodetector 10A created in Example 1.

Comparative Example 2

In place of the photoelectric conversion layer 22 in the photodetector 10A created in Example 1, a comparative photoelectric conversion layer was formed, which contained a hexamer of α-oligothiophene and a fullerene $C_{60}$ at a content ratio of 0.6:1 by the weight. A comparative photodetector B was created in an identical manner to that of Example 1 except for this point.

With regard to the created comparative photodetector B, radiation of 488-nm light L and voltage application to the electrode layers 24A and 24B were performed, and the photoelectric conversion efficiency was measured. The photoelectric conversion efficiency when a voltage of −14 volts was applied was 50%.

Evaluation

As described in Example 1 and the comparative example 1, the photoelectric conversion efficiency of the photodetector 10A created in Example 1 when a voltage of −15 volts was applied was 1000 times or more the photoelectric conversion efficiency of the comparative photodetector A created in the comparative example 1 (see an arrow X in FIG. 5). As described in Example 1 and the comparative example 2, the photoelectric conversion efficiency of the photodetector 10A created in Example 1 when a voltage of −14 volts was applied was 5000 times or more the photoelectric conversion efficiency of the comparative photodetector B created in the comparative example 2.

Therefore, the photodetector 10A created in Example 1 achieved significant improvements on the sensitivity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photoelectric conversion element comprising:
a first electrode layer;
a second electrode layer; and only one photoelectric conversion layer arranged between the first electrode layer and the second electrode layer, wherein the only one photoelectric conversion layer converts light to charges, the only one photoelectric conversion layer contains oligothiophene and fullerene selected from a group including the fullerene and derivatives thereof, the oligothiophene is a hexamer of α-oligothiophene, and a weight of the oligothiophene is equal to or greater than 100 times a weight of the fullerene and smaller than 500 times the weight of the fullerene.

2. The photoelectric conversion element according to claim 1, wherein the fullerene is a fullerene $C_{60}$.

3. A photodetector comprising a substrate and the photoelectric conversion element according to claim 1 that is supported by the substrate, wherein the photodetector outputs a signal according to a voltage applied to the first electrode layer and the second electrode layer.

4. The photoelectric conversion element according to claim 1, wherein the weight of the oligothiophene contained in an entirety of the only one photoelectric conversion layer is equal to or greater than 100 times and smaller than 500 times the weight of the fullerene contained in the entirety of the only one photoelectric conversion layer.

5. The photoelectric conversion element according to claim 1, wherein a weight of the oligothiophene is 100 times a weight of the fullerene.

6. A photoelectric conversion element comprising:

a photoelectric conversion layer that converts light to charges, wherein the photoelectric conversion layer contains oligothiophene and fullerene selected from a group including a fullerene and derivatives thereof, the oligothiophene is a hexamer of α-oligothiophene, and a weight ratio of the oligothiophene to the fullerene is 500:1 to 100:1.

7. The photoelectric conversion element according to claim 6, wherein the photoelectric conversion layer is a vapor-deposited layer.

8. The photoelectric conversion element according to claim 6, wherein the hexamer of α-oligothiophene is a hexamer of unsubstituted α-oligothiophene.

9. The photoelectric conversion element according to claim 8, wherein the fullerene is a fullerene $C_{60}$.

10. The photoelectric conversion element according to claim 8, wherein a weight ratio of the oligothiophene to the fullerene is 100:1.

11. The photoelectric conversion element according to claim 1, wherein the hexamer of α-oligothiophene is a hexamer of unsubstituted α-oligothiophene.

12. The photoelectric conversion element according to claim 1, wherein the photoelectric conversion layer is a vapor-deposited layer.

* * * * *